United States Patent [19]

Takahashi et al.

[11] Patent Number: 5,177,592
[45] Date of Patent: Jan. 5, 1993

[54] SEMICONDUCTOR DEVICE

[75] Inventors: Katsuyuki Takahashi; Kenji Kodera; Mutsumi Sasaki, all of Tochigi, Japan

[73] Assignee: Nippon Precision Circuits Ltd., Tokyo, Japan

[21] Appl. No.: 671,554

[22] Filed: Mar. 19, 1991

[30] Foreign Application Priority Data

Mar. 19, 1990 [JP] Japan .................. 2-68903

[51] Int. Cl.⁵ .......................... H01L 29/52
[52] U.S. Cl. ................... 257/758; 257/380
[58] Field of Search ......... 357/65, 68, 69, 70, 357/71

[56] References Cited

U.S. PATENT DOCUMENTS

| | | | |
|---|---|---|---|
| 5,047,825 | 9/1991 | Yasaka et al. | 357/42 |
| 5,059,555 | 10/1991 | Iranmanesh et al. | 437/192 |
| 5,068,711 | 11/1991 | Mise | 357/71 |
| 5,072,282 | 12/1991 | Takagi et al. | 357/71 |
| 5,073,813 | 12/1991 | Morita et al. | 357/49 |
| 5,075,762 | 12/1991 | Kondo et al. | 357/71 |
| 5,079,617 | 1/1992 | Yoneda | 357/71 |
| 5,084,404 | 1/1992 | Sharpe-Geisler | 437/51 |
| 5,091,768 | 2/1992 | Yamazaki | 357/71 |

Primary Examiner—Frank Gonzalez
Attorney, Agent, or Firm—Jordan and Hamburg

[57] ABSTRACT

A semiconductor includes a conductor layer formed on one side thereof toward a first surface of a substrate, and a first interlayer insulation layer on the conductor layer. The first interlayer insulation layer has a first opening extending therethrough to the conductor layer. A first wiring layer is provided on the first interlayer insulation layer, and connected to the conductor layer via the first opening. A second interlayer insulation layer is formed on the first wiring layer and has a second opening extending through the first opening to the first wiring layer. A second wiring layer is formed on the second interlayer insulation layer and extends through the second interlayer to the first wiring layer and/or the conductor layer via the first opening and the second opening.

8 Claims, 3 Drawing Sheets

SEMICONDUCTOR DEVICE

FIELD OF THE INVENTION

This invention relates to a semiconductor device having a multilayered wiring structure.

BACKGROUND OF THE INVENTION

Silicon integrated circuits that have been produced in recent years generally have so called multilayered wiring structures.

FIG. 3 is a cross sectional view of a known embodiment of an MOS silicon integrated circuit having a multilayered structure. The arrangement illustrated in this figure is a portion of a static RAM.

The elements of the structure of FIG. 3 include a silicon substrate 51, a field insulation layer 52 of a LOCOS structure, a gate insulation layer 53, a gate electrode 54, a source 56, a drain 57, a first interlayer insulation layer 58 and a second interlayer insulation layer 60. In addition, the structure includes a polysilicon layer 59 that comprises a first wiring layer having a high resistance region formed in a portion thereof to constitute a high resistance load for the static RAM. The aluminum layers 61a, 61b and 61c form a second wiring layer. The aluminum layers 61b and 61c are connected to the gate electrode 54 and the source 56 via openings formed in the first interlayer insulation layer 58 and the second interlayer insulation layer 60, respectively. The aluminum layer 61a is connected to the polysilicon layer 59 via the opening formed in the second interlayer insulation layer 60.

In the above described arrangement, the opening for the connection of the gate electrode 54 and the opening for the connection of the source 56 are formed in the same step. For this purpose, the opening for the connection of the polysilicon layer 59 can be formed by etching only the second interlayer insulation layer 60, but the first interlayer insulation layer has to be etched further in order to form the opening for the connection of the gate electrode 54 and the opening for the connection of the source 56. Accordingly, the polysilicon layer 59 is exposed to an etchant in the opening for the connection of the polysilicon layer 59, for a long period of time even after the completion of the etching for the second interlayer insulation layer 60. Therefore, a problem arises that etching is effected as far as the polysilicon layer 59, which should not be etched, resulting in conduction failure of the device.

SUMMARY OF THE INVENTION

The present invention is directed to the provision of a semiconductor device having a multilayer wiring structure that has reliable conduction between the first wiring layer and the second wiring layer, even if the first wiring layer is exposed to an etching material for a long period of time during the formation of an opening in the device.

BRIEF DESCRIPTION OF THE DRAWING

In order that the invention may be more clearly understood, it will now be disclosed in greater detail with reference to the accompanying drawing, wherein.

DESCRIPTION OF THE PREFERRED EMBODIMENTS

Figure 1:
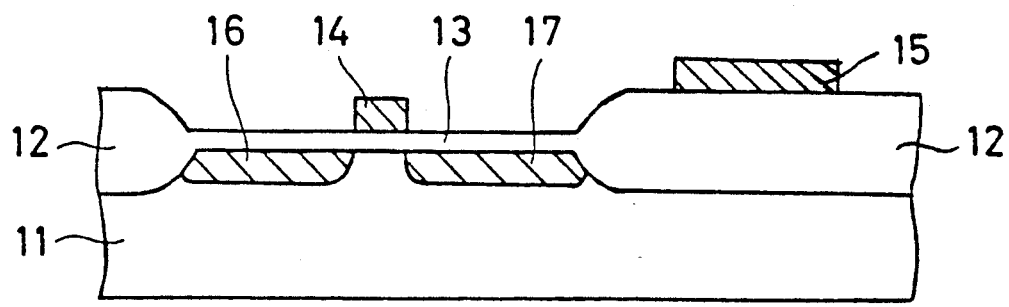
FIGS. 1(A)-1(E) are cross sectional views of a semiconductor device during successive steps of manufacturing thereof, for producing a semiconductor device, i.e. a RAM, in accordance with a preferred embodiment of the invention, it being understood of course that the invention is not limited to structures for a RAM.
Figure 1:
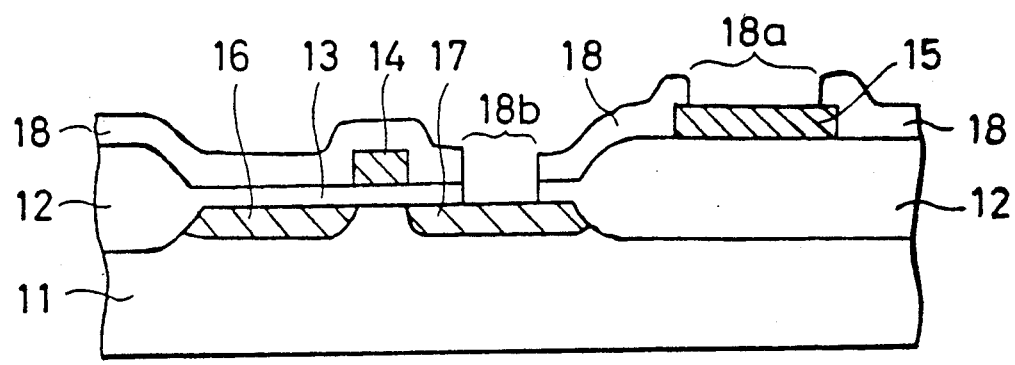
Figure 1:
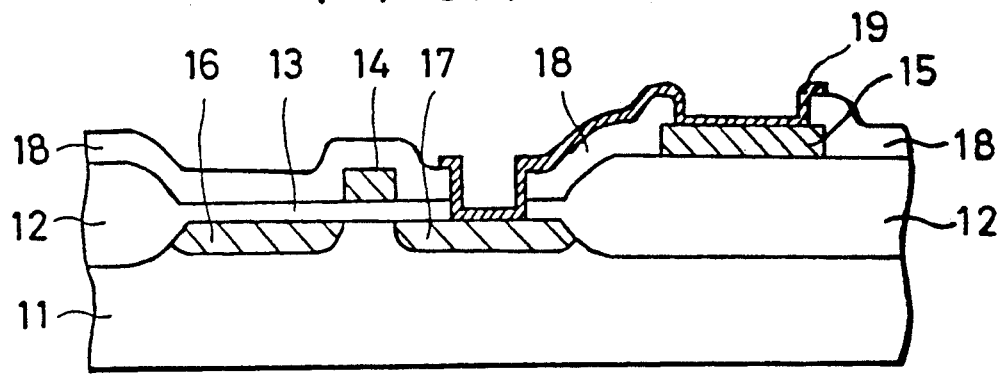
Figure 1:
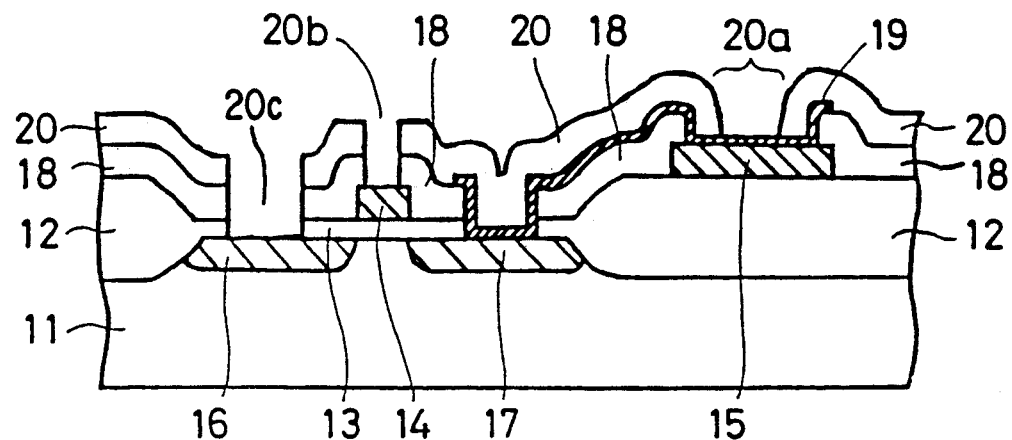
Figure 1:
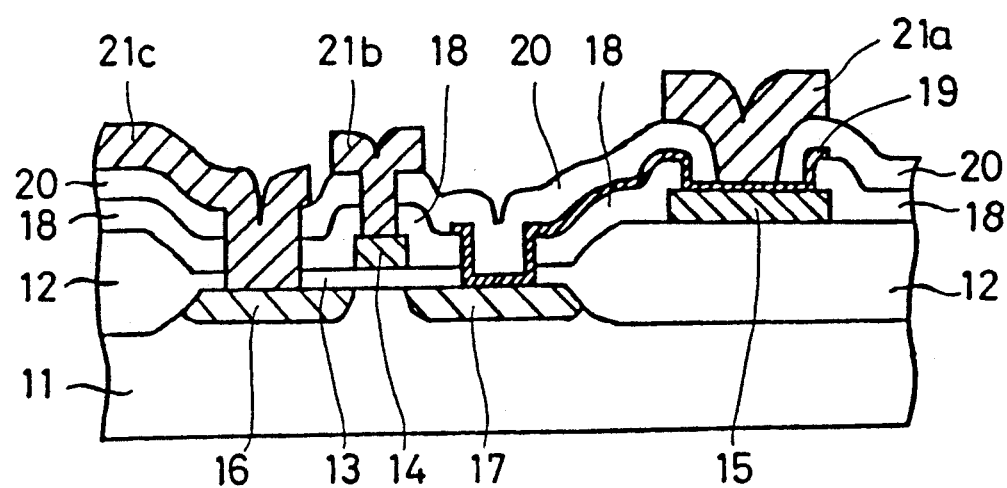

Referring now to FIGS. 1(A)-1(E), therein is illustrated a silicon substrate 11, a field insulation layer 12 of a LOCOS structure, and a gate insulation layer 13 of, for example, a 30 nm thick film. The gate electrode 14 is of polysilicon. The conductor layer 15 that, similar to the gate electrode 14, is also of polysilicon. The structure further includes a source 16 and a drain 17. The first interlayer insulation layer 18 is formed of a silicon oxide film having a thickness of 300 nm. A first opening 18a is formed within the boundary of the conductor layer 15. The opening 18b is an opening for the drain 17.

The first wiring layer 19 is a 50 nm thick film of polysilicon. The first wiring layer 19 connects the drain 17 to the second wiring layer 21a, to be described later. A high resistance region is formed on a part of the wiring layer 21a and comprises a high resistance load for the static RAM. The second interlayer insulation layer is a 300 nm thick film of silicon oxide. The second opening 20a is formed inwardly of the boundary of the first opening 18a. The opening 20b is provided for the gate electrode, and the opening 20c is provided for the source. The aluminum layers 21a, 21b and 21c form the second wiring layer.

The process steps for forming a preferred embodiment of a semiconductor device in accordance with the invention are illustrated sequentially in FIGS. 1(A)-1(E).

As shown in FIG. 1(A), the gate electrode 14 is formed on the gate insulation layer 13, and the conductor layer 15 is formed on the field insulation layer 12 in the same step. That is, after providing a polysilicon layer for forming the gate electrode 14 and the conductor layer 15 by a CVD process, on one side of a main surface of the silicon substrate 11, the polysilicon layer is patterned to form the gate electrode 14 and the conductor layer 15 at the same time.

As shown in FIG. 1(B), after the first interlayer insulation layer 18 is formed by a CVD process, a portion thereof is dry etched to form a first opening 18a and a second opening 18b for the drain. The gate insulation film 13 is etched at the same time in the drain opening 18b. An etching gas $CHF_3$ can be used for this etching process.

As shown in FIG. 1(C), after a high resistance polysilicon layer is provided on the surface of the resultant structure away from the main surface of the substrate 1, this polysilicon layer is patterned to form the first wiring layer 19. Then impurities are doped in the high resistance layer while masking a portion thereof to reduce the resistance of the polysilicon layer, as compared with the remainder of this layer. The high resistance polysilicon layer, in the masked portion thereof, constitutes a high resistance load for the static RAM.

In the next step, as shown in FIG. 1(D), after forming a second interlayer insulation layer 20 with the CVD process, a portion thereof is dry etched to form the second opening 20a, opening 20b for the gate electrode, and opening 20c for the source. This etching step is effected simultaneously into the first interlayer insulation layer 18 in the opening 20b, for the gate electrode, and into the first interlayer insulation layer 18 and the gate insulation layer 13 in the opening 20c for the source respectively. An etching gas CHF₃ can be used for this etching process. Subsequently, a plasma treatment is effected using CF₄ gas to clean the surface of the openings 20a, 20b and 20c.

Then, as illustrated in FIG. 1(E), the aluminum layer is formed on the surface of the resultant device away from the main surface of the substrate 1, and the aluminum layer is patterned to form the second wiring layers 21a, 21b and 21c. The second wiring layer 21a is connected to the first wiring layer 19 via the first opening 18a and the second opening 20a.

Figure 2:
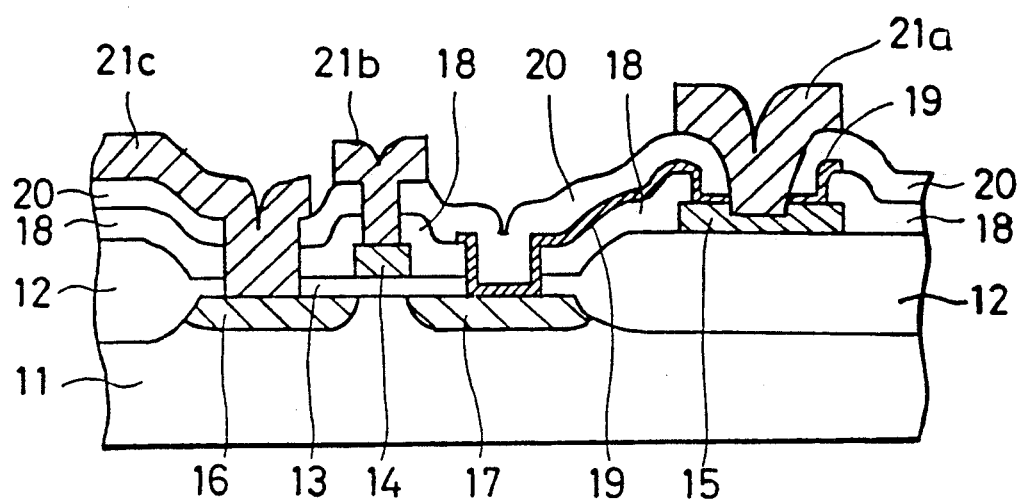
FIG. 2 is a cross sectional view of a modification of the semiconductor device in accordance with the invention.
Figure 3:
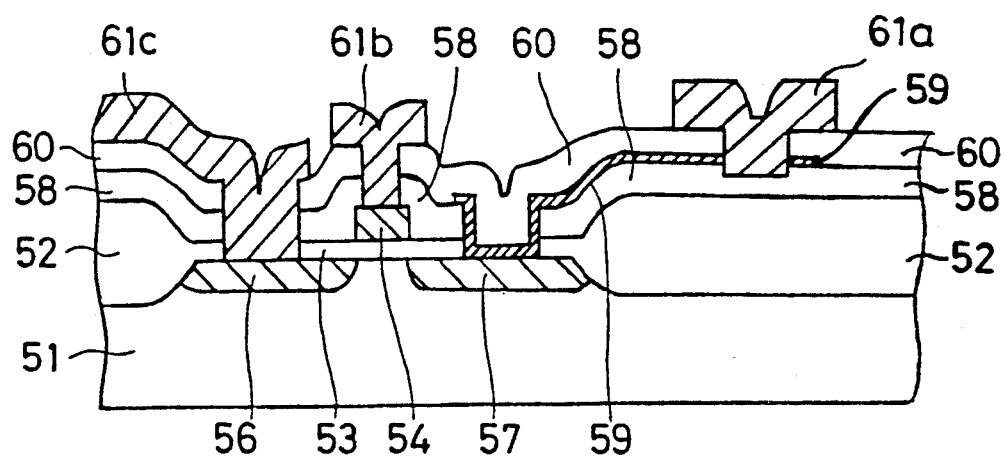
FIG. 3 illustrates a cross sectional view of a known semiconductor device.

In a modification of the step illustrated in FIG. 1(D), the first wiring layer formed in the second opening 20a may be etched through, if desired. In this instance, the second wiring layer 21a is directly connected to the conductor layer 15, as shown in FIG. 2. Accordingly, the first wiring layer 19 and the second wiring layer 21a are connected via the conductor layer 15, so that no conduction failure occurs between the first wiring layer 19 and the second wiring layer 21a. The structure shown in FIG. 2 has advantage that, if the adhesion is poor or the contact resistance is increased between the first wiring layer 19 and the second wiring layer 21a, depending upon the combination thereof, the reliability and the characteristics of the device can be improved, as long as the combination of the conductor layer 15 and the second wiring layer 21a has a satisfactory adhesion and low contact resistance.

In accordance with the present invention, since a conductor layer is formed in the opening, even if the first wiring layer is exposed, upon forming the opening, to the etching material for a long period of time, reliable conduction can be provided between the first wiring layer and the second wiring layer.

While the invention has been disclosed and described with reference to a small number of embodiments, it will be apparent that variations and modification may be made therein, and it is therefore intended in the following claims to cover each such variation and modification as falls within the true spirit and scope of the invention.

What is claimed is:

1. A semiconductor device comprising:
   a semiconductor substrate having a first side;
   a conductor layer formed on said device and having a side thereof toward said first side of said semiconductor substrate,
   a first interlayer insulation layer having a first opening extending therethrough to said conductor layer,
   a first wiring layer formed on said first interlayer insulation layer and connected to said conductor layer via said first opening,
   a second interlayer insulation layer formed on said first wiring layer and having a second opening corresponding to said first opening, and
   a second wiring layer connected to said first wiring layer via said first opening and said second opening.

2. The semiconductor device of claim 1 wherein a portion of said first wiring layer comprises a resistor.

3. The semiconductor device of claim 1 wherein said first opening is larger than said second opening, whereby said second interlayer insulation layer extends through said first opening.

4. A semiconductor device comprising:
   a semiconductor substrate having a first surface;
   a conductor layer formed on said device and having a side toward said first surface of said semiconductor substrate,
   a first interlayer insulation layer having a first opening extending therethrough to said conductor layer,
   a first wiring layer formed on said first interlayer insulation layer and connected to said conductor layer via said first opening,
   a second interlayer insulation layer formed on said first wiring layer and having a second opening corresponding to said first opening, and
   a second wiring layer connected to said first wiring layer and said conductor layer via said first opening and said second opening.

5. The semiconductor device of claim 4 wherein a portion of said first wiring layer comprises a resistor.

6. The semiconductor device of claim 4 wherein said first opening is larger than said second opening, whereby said second interlayer insulation layer extends through said first opening.

7. In a semiconductor device having a substrate, a field insulation layer on the substrate, a first interlayer insulation layer on the side of said device toward said substrate, a first wiring layer on the first interlayer insulation layer, a second interlayer insulation layer on the first wiring layer, said second interlayer insulation layer having an opening extending therethrough to said first wiring layer, and a second wiring layer on said second interlayer insulation layer and extending through said opening to be electrically connected to said first wiring layer, the improvement comprising a conductor layer on said field insulation layer, said first interlayer insulation layer being formed o said conductor layer and having an opening extending therethrough to said conductor layer, said first wiring layer extending through said opening in said first interlayer insulation layer to said conductor layer, said opening in said second interlayer insulation layer being aligned with said opening in said first interlayer insulation layer.

8. The semiconductor device of claim 7 wherein said opening in said first insulation layer is larger than said opening in said second interlayer insulation layer, and said second interlayer insulation layer extends through said opening in said first interlayer insulation layer.

* * * * *